United States Patent [19]

O'Dell

[11] Patent Number: 4,912,620
[45] Date of Patent: Mar. 27, 1990

[54] LOSSLESS CLIPPER WITH PEAK REGULATION FEATURE

[75] Inventor: Arthur B. O'Dell, Cupertino, Calif.

[73] Assignee: Boschert, Inc., Fremont, Calif.

[21] Appl. No.: 355,264

[22] Filed: May 19, 1989

[51] Int. Cl.$^4$ ........................................... H02M 3/335
[52] U.S. Cl. ........................................ 363/56; 363/21; 363/97
[58] Field of Search ................. 363/20, 21, 56, 95, 363/97, 131; 361/18

[56] References Cited

U.S. PATENT DOCUMENTS

| | | | |
|---|---|---|---|
| 3,564,393 | 2/1971 | Williamson | 363/21 |
| 3,697,852 | 10/1972 | Gerbitz | 363/21 |
| 4,323,957 | 4/1982 | Clark, Jr. et al. | 363/21 |
| 4,438,486 | 3/1984 | Ferraro | 363/56 |
| 4,460,949 | 7/1984 | Steigerwald | 363/28 |
| 4,477,868 | 10/1984 | Steigerwald | 363/28 |
| 4,502,085 | 2/1985 | Morrison et al. | 363/56 |
| 4,561,046 | 12/1985 | Kuster | 363/21 |
| 4,652,809 | 3/1987 | Barn | 363/56 |
| 4,691,270 | 9/1987 | Pruitt | 363/56 |
| 4,697,219 | 9/1987 | Mitsuoka | 361/93 |

OTHER PUBLICATIONS

Witcomb, "Designing Non-Dissipative Current Snubbers for Switched Mode Converters", pp. B1-1 to B1-5.
Shaughnessy, "Modelling and Design of Non-Dissipative LC Snubber Networks", Proceedings of Powercon 7, pp. G4-1 to G4-9.
Watanabe et al., "Self-Running Converter Utilizing Partial Resonance", 1988 IEEE, pp. 186-193.
Zach et al., "New Lossless Turn-On and Turn-Off (Snubber) Networks for Inverters, Including Circuits for Blocking Voltage Limitation", 1986 IEEE Transactions on Power Electronics, vol. PE-1, No. 2, Apr. 1986, pp. 65-75.
Sathe, "Coupled Inductor Lossless Snubber Circuit for a Transistor Switching Converter", IBM Technical Disclosure Bulletin, vol. 26, No. 10A, Mar. 1984, pp. 5210-5213.

Primary Examiner—Peter S. Wong
Attorney, Agent, or Firm—Skjerven, Morrill, MacPherson, Franklin & Friel

[57] ABSTRACT

A snubber circuit reduces the magnitude of a flyback voltage pulse across a switching transistor caused by a transformer while incurring essentially no power losses. In one embodiment, the snubber circuit modulates the voltage pulse across the switching transistor so that the sum of the input line voltage and the flyback voltage pulse remain substantially independent of input voltage.

6 Claims, 3 Drawing Sheets

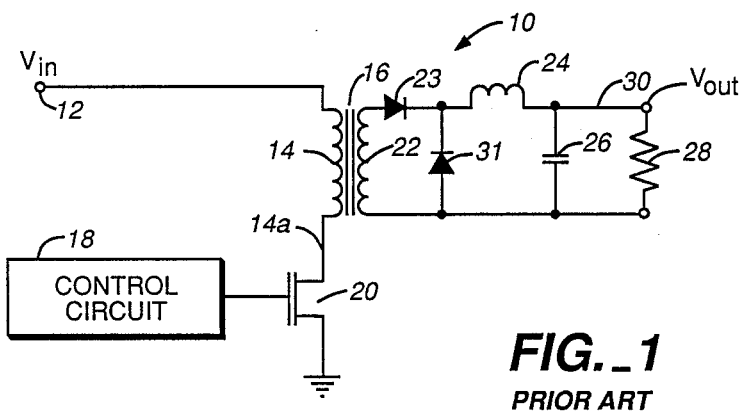
FIG._1
*PRIOR ART*
FIG._3a
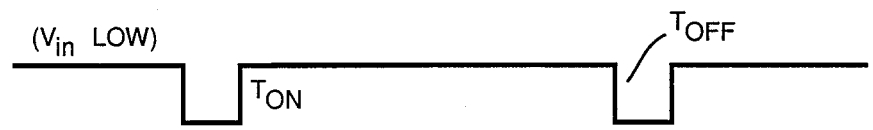
FIG._3b

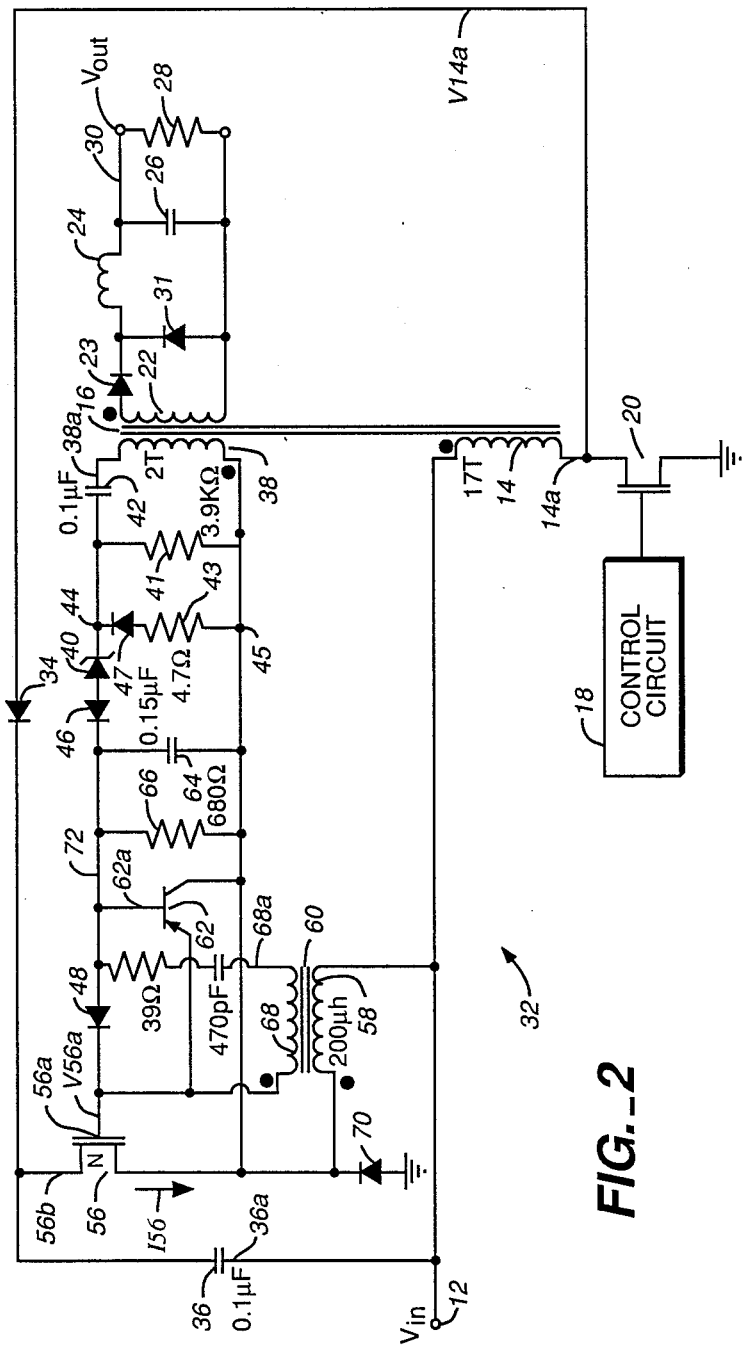
FIG._2

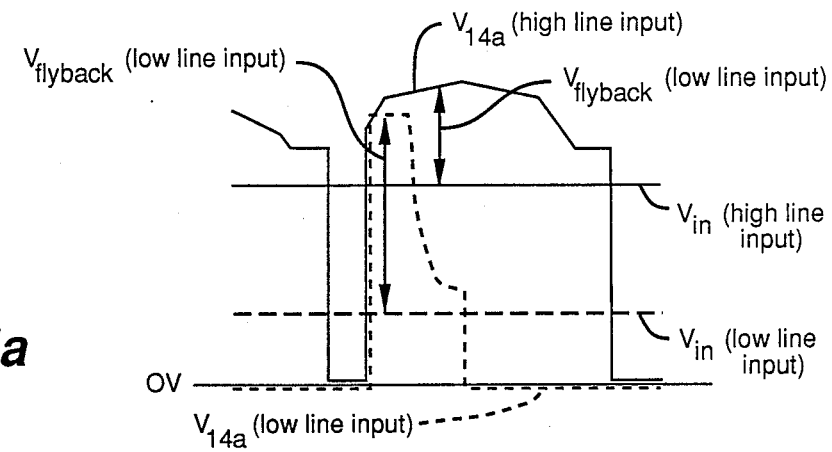
FIG._4a
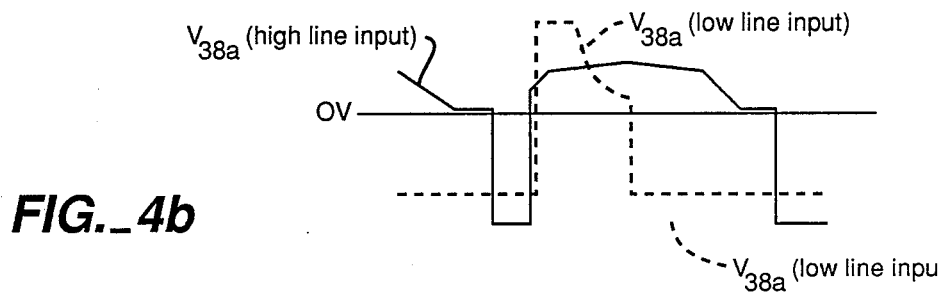
FIG._4b
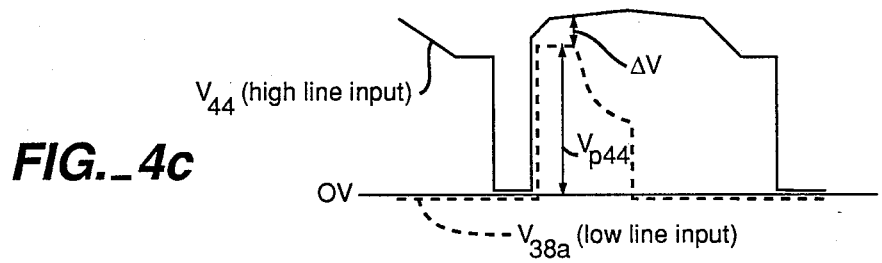
FIG._4c
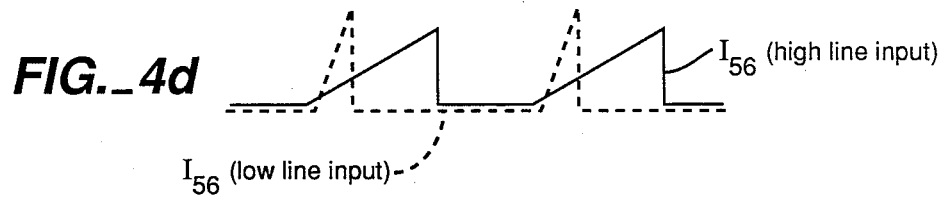
FIG._4d
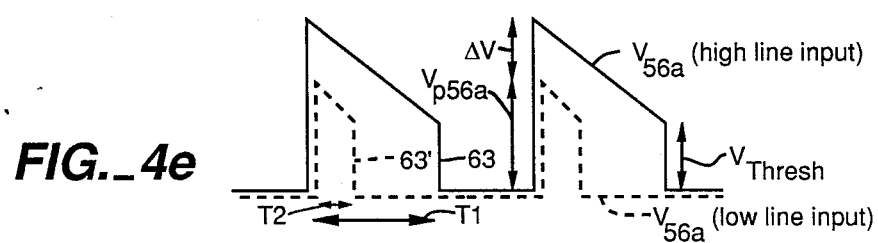
FIG._4e

LOSSLESS CLIPPER WITH PEAK REGULATION FEATURE

BACKGROUND OF THE INVENTION

This invention relates to snubber and clipper circuits for limiting the voltage across a power transistor.

FIG. 1 illustrates a portion of a prior art single-ended forward converter 10 constructed in accordance with the prior art. Referring to FIG. 1, an input voltage $V_{in}$ is applied to an input terminal 12, which in turn is coupled to the primary winding 14 of a transformer 16. Periodically, a control circuit 18 turns on a transistor 20, thereby causing current to flow from terminal 12, through winding 14 and transistor 20, and to ground, and causing current to flow through a secondary winding 22, through a diode 23 and a choke inductor 24, and to load circuitry comprising a filter capacitor 26 and a load 28. In order to modulate output voltage $V_{out}$ at output lead 30, periodically, control circuit 18 turns off transistor 20 so that power is no longer transferred from primary winding 14 to secondary winding 22. (During the time period in which transistor 20 is off, choke inductor 24 typically continues to draw current through a diode 31.) By controlling the duty cycle of transistor 20, the amount of time power is delivered to winding 22 from winding 14, and the amount of energy delivered to load 28 each switching cycle can be controlled. Further details concerning single-ended forward converters (and other types of power supplies) are described in "High-Frequency Switching Power Supplies: Theory and Design" by George Chryssis, published by McGraw Hill Book Company in 1984, incorporated herein by reference.

Because of the inductive nature of transformer 16, when transistor 20 is on and current is flowing through windings 14 and 22, magnetic flux, corresponding to the volt-seconds applied across winding 14, accumulates in transformer 16. Accordingly, when transistor 20 turns off, a high flyback voltage appears at lead 14a of winding 14. If the flyback voltage at lead 14a is sufficiently large and exceeds the maximum voltage specified by the transistor manufacturer, it could cause a catastrophic failure in transistor 20. Accordingly, it is known in the art to provide snubber circuits across transistors to limit the voltage excursions across the transistors and prevent their destruction. Unfortunately, prior art snubber circuits dissipate power, thereby reducing the efficiency of the power supply.

SUMMARY

A snubber circuit in accordance with my invention controls the flyback voltage pulses (generated by a transformer) across a switching transistor. Of importance, the snubber circuit dissipates substantially no energy. In addition, the snubber circuit modulates the magnitude of the flyback pulses to thereby modulate the voltage across the transformer when the switching transistor is off.

In other embodiments of my invention, the snubber circuit is used to protect switching devices other than transistors, e.g. thyristors, SCR's, etc. Also, the snubber circuit may be used in devices other than single-ended forward converters, e.g. flyback power supplies.

BRIEF DESCRIPTION OF THE DRAWINGS

FIG. 1 illustrates a single-ended forward converter constructed in accordance with the prior art.

FIG. 2 illustrates a lossless snubber circuit coupled to a forward converter in accordance with one embodiment of my invention.

FIG. 3a illustrates the on-time and off-time of transistor 20 of FIG. 2 under high input voltage conditions.

FIG. 3b illustrates the on-time and off-time of transistor 20 under low input voltage conditions.

FIGS. 4a to 4e illustrate signal waveforms at various nodes within the structure of FIG. 2.

DETAILED DESCRIPTION

Referring to FIG. 2, input voltage $V_{in}$ is applied to input terminal 12, which is coupled via primary winding 14 to switching transistor 20. When transistor 20 turns on, current flows through input terminal 12, through primary winding 14 and switching transistor 20 to ground, thereby causing current to be delivered by secondary winding 22 to choke inductor 24 and load 28 coupled to output terminal 30. When transistor 20 turns off, the voltage at lead 14a starts to rise. However, in accordance with my invention, a snubber or clipper circuit 32 coupled to transformer 16 prevents the voltage at lead 14a from increasing beyond a value which could damage transistor 20. In one embodiment, circuit 32 ensures that the voltage across transistor 20 never exceeds a value slightly less than 500V.

It is noted that when transistor 20 turns off, the voltage across transistor 20 equals input voltage $V_{in}$ plus the flyback voltage caused by the inductive nature of transformer 16. In accordance with another feature of my invention, circuit 32 also ensures that the sum of input voltage $V_{in}$ and the flyback voltage when transistor 20 turns off is a value slightly less than 500 volts regardless of variations in input voltage $V_{in}$. The reason for ensuring that voltage V14a at lead 14a is controlled to a substantially constant value is as follows. During operation, periodically transistor 20 turns on (at a fixed frequency), thereby applying a number of volt-seconds across winding 14. When transistor 20 turns off, a flyback voltage pulse, caused by the stored magnetic flux collapsing within transformer 20, appears across winding 14, thereby applying volt-seconds across winding 14. It is necessary to ensure that the number of volt-seconds appearing across winding 14 when transistor 20 is on equals the number of volt-seconds appearing across winding 14 when transistor 20 is off to thereby reset transformer 16. If this is not the case, the amount of flux in transformer 16 will increase from cycle to cycle until transformer 16 saturates—an undesirable result.

Referring to FIG. 3b, assume that the converter is being operated under conditions of low input voltage $V_{in}$ at input lead 12. Output voltage $V_{out}$ can be calculated as follows:

$$V_o = V_{in} \times DF \times ST/PT$$

where DF is the duty factor and ST/PT is the turns ratio of winding 22 to winding 14. If voltage $V_{in}$ drops, in order to provide an appropriate output voltage, each switching period transistor 20 remains on for a longer period $T_{ON}$ with a higher duty factor DF than transistor 20 would have under high input voltage conditions (see FIG. 3a). Thus, under low input voltage conditions, transistor 20 remains off a smaller amount of time $T_{OFF}$ each switching cycle than if input voltage $V_{in}$ were high. Because it is necessary to maintain an appropriate number of volt-seconds across winding 14 when transistor 20 is off, and off-time $T_{OFF}$ of transistor 20 is short during low input voltage conditions, it is necessary that the flyback voltage pulse appearing across winding 14 when transistor 20 turns off be permitted to reach a greater magnitude than this pulse would be permitted to reach if the voltage $V_{in}$ were high. However, in no event must the sum of the magnitude of this pulse plus input voltage $V_{in}$ be permitted to exceed 500 volts or transistor 20 could be damaged.

When the voltage at lead 14a increases, e.g. during a flyback pulse, a current flows from lead 14a through a diode 34 and a capacitor 36, thereby causing capacitor 36 to begin charging. In addition, because of the magnetic coupling between windings 14 and 38, when the voltage across winding 14 starts to increase, the voltage across winding 38 also starts to increase. Lead 38a of winding 38 is coupled to a Zener diode 40 via an RC DC restoring network consisting of resistors 41 and 43, capacitor 42, and diodes 47 and 46. Zener diode 40 typically has a breakdown voltage of about 39 volts Accordingly, when the voltage at a node 44 is greater than 39 volts, Zener diode 40 breaks down, thereby causing current to flow through forward biased diodes 46 and 48, and thereby causing the voltage at gate lead 56a of MOS transistor 56 to increase. When the voltage at gate lead 56a is sufficiently high, transistor 56 turns on, thereby permitting current to flow from lead 14a, through diode 34, transistor 56, winding 58 of transformer 60, and to voltage input lead 12. In addition, current is permitted to flow from capacitor 36 through transistor 56, winding 58, and to lead 12. Thus, capacitor 36 spends a portion of each switching cycle charging and a portion of each switching cycle discharging. The amount of charge stored on capacitor 36 (and thus the voltage across capacitor 36) depends on the amount of time each switching cycle capacitor 36 spends charging and the amount of time capacitor 36 spends discharging. The magnitude of the flyback pulse across winding 14 depends on the voltage across capacitor 36. Thus, by controlling the voltage across capacitor 36 (by controlling the on-time of transistor 56), the size of the flyback pulse across winding 14 is controlled.

It should be noted that because capacitor 36 is discharged through transistor 56, winding 58 and input lead 12, the energy stored across capacitor 36 is returned to the DC power source coupled to lead 12, and is not lost or wasted.

The voltage across winding 14 at which transistor 56 will start to conduct is as follows:

$$V_{COND} = \left[\left(\frac{C_{42}}{C_{64} + C_{42}} \times V_{GS}\right) + V_{Zener} + V_{Diode}\right] \times \frac{PT}{CT}$$

where $V_{GS}$ is the gate threshold voltage of transistor 56, $C_{42}$ and $C_{64}$ are the capacitances of capacitors 42 and 64, respectively, $V_{Zener}$ is the breakdown voltage of zener diode 40 (about 39 volts), $V_{Diode}$ is the forward bias voltage drop across diodes 46 and 48 (about 1.4 volts), and PT/CT is the turns ratio of winding 14 to winding 38 (about 17:2).

Of importance, gate 56a of transistor 56 is capacitive. After a voltage pulse is applied to gate lead 56a, capacitive gate 56a is permitted to discharge through transistor 62. The voltage at the base 62a of transistor 62 decreases at an exponential rate through the RC circuit consisting of capacitor 64 and resistor 66. Thus, the voltage $V_{56a}$ at gate lead 56a also drops exponentially. The time required for the voltage at gate 56a to drop below the threshold voltage of transistor 56 depends on (1) the RC time constant of capacitor 64 and resistor 66, and (2) the magnitude of the voltage pulse applied to gate 56a. Thus, if a high voltage pulse is applied to gate 56a, transistor 56 remains on longer than if a lower voltage pulse was applied to lead 56a.

FIGS. 4a to 4e illustrate various voltage and current waveforms present in the circuit of FIG. 2 under high input voltage conditions, e.g., when voltage $V_{in}$ equals about 265V (solid line) and under low input voltage conditions, e.g., when voltage $V_{in}$ equals about 85V (dotted line) Referring to FIG. 4a, it is seen that circuit 32 ensures that voltage $V_{in}$ plus the flyback voltage remains substantially constant despite variations in voltage $V_{in}$.

FIG. 4b illustrates the voltage waveform $V_{38a}$ across lead 38a, and FIG. 4c illustrates the voltage waveform $V_{44}$ provided at node 44 by DC restoring network 42 relative to the voltage at node 45. As can be seen, voltage $V_{44}$ is proportional to voltage $V_{14a}$.

It is noted that the peak magnitude of voltage $V_{44}$ under high input voltage conditions is slightly higher than under low input voltage conditions by an amount $\Delta V$. Voltage $\Delta V$ is relatively small compared with the peak voltage $Vp_{44}$ at node 44 under low input voltage conditions. However, because of the voltage drop across Zener diode 40 and diodes 46, 48, voltage $\Delta V$ is substantial compared with peak voltage $Vp_{56a}$ at gate 56a under low input voltage conditions. As can be seen in FIG. 4e, if a high voltage pulse is applied to gate 56a, it takes a longer time (T1) to decay below threshold voltage $V_{Thresh}$ of transistor 56 than if a small voltage pulse is applied to gate 56a (time T2). Thus, voltage difference $\Delta V$ accounts for the fact that transistor 56 remains on longer each switching cycle under high input voltage conditions than under low input voltage conditions.

As voltage $V_{56a}$ falls below threshold voltage $V_{Thresh}$ of transistor 56, current stops flowing through winding 58 of transformer 60. This cut off in current causes a voltage to develop across a winding 68, which in turn rapidly pulls down the voltage at lead 68a of winding 68, which in turn pulls the base voltage of transistor 62 down, thereby causing transistor 62 to pull down the voltage at gate 56a, and to rapidly turn off transistor 56 (e.g., at time 63 and 63' in FIG. 4e). This ensures that transistor 56 operates only very briefly in the linear range of operation and therefore that transistor 56 dissipates essentially no energy.

Because transistor 56 is on only during short time period T2 under low input voltage conditions, capacitor 36 spends only a short amount of time discharging each switching cycle. Therefor, more charge accumulates on capacitor 36 under low input voltage conditions than under high input voltage conditions, and thus there is a greater voltage across capacitor 36 under low input voltage conditions than under high input voltage conditions. Because of this, when transistor 56 turns on, current through winding 58 ramps up more rapidly under low input voltage conditions than under high input voltage conditions. However, the energy transferred from capacitor 36 to input lead 12 under low input voltage conditions is about equal to the amount of energy transferred from capacitor 36 under high input voltage conditions. (The amount of energy transferred from capacitor 36 to lead 12 each switching cycle is dependent on the power delivered to the load, and relatively independent of input voltage $V_{in}$.)

Operation of circuit 32 under conditions in which input voltage $V_{in}$ decreases is as follows. If input voltage $V_{in}$ decreases, the amplitude of the drive waveform $V_{56a}$ at the gate of transistor 56 decreases, causing transistor 56 to be on for a shorter period of time each switching cycle. This causes an increase in the voltage across capacitor 36 (because capacitor 36 spends a greater portion of each switching cycle charging and a smaller portion of each switching cycle discharging). As the voltage across capacitor 36 increases, the peak discharge current $I_{56}$ through transistor 56 increases until an equilibrium is reached such that the energy delivered into clipper circuit 32 each switching cycle equals the energy transferred by clipper circuit 32 through transistor 56 to the voltage supply driving input lead 12. Since the magnitude of the flyback pulse across winding 14 depends on the voltage across capacitor 36, the increase in voltage across capacitor 36 causes a corresponding increase in flyback voltage magnitude.

If input voltage $V_{in}$ increases, the amplitude of the pulse across winding 14 also increases, the amplitude of the pulse across winding 38 increases, the on-time per switching cycle of transistor 56 increases, and the voltage across capacitor 36 starts to drop. This causes a reduction in the amplitude of the flyback voltage pulse permitted across winding 14. In this way, flyback pulse across winding 14 is modulated to a value dependent on input voltage $V_{in}$ such that the sum of input voltage $V_{in}$ plus the flyback pulse is substantially constant. In one embodiment, if input voltage $V_{in}$ varies between 100 and 400 volts, the magnitude of the voltage pulse at lead 14a stays in a range between 470 and 500 volts.

As illustrated in FIG. 2, a diode 70 is coupled to winding 58 of transformer 60. Diode 70 is provided so that when transistor 56 turns off, winding 58 can continue to draw current through diode 70.

In another embodiment of my invention, instead of providing diode 48 and transistor 62, node 72 is connected directly to gate lead 56a of transistor 56. While this embodiment comes within the scope of my invention, I have discovered that adding diode 48 and transistor 62 causes circuit 32 to be more noise insensitive. Further, the network comprising diode 48 and transistor 62 makes circuit 32 less sensitive to Miller capacitive coupling between drain lead 56b and gate lead 56a. (This Miller capacitive coupling would otherwise tend to load the RC network comprising capacitor 64 and resistor 66 and increase the time transistor 66 would stay in the linear operation region.)

While the invention has been described with regard to a specific embodiment, those skilled in the art will recognize that changes can be made in form and detail without departing from the spirit and scope of the invention. For example, a clipper circuit in accordance with my invention can be used with a flyback converter, such as discussed by the above-incorporated Chryssis reference. Also, lead 36a of capacitor 36 can be coupled to receive a DC voltage other than $V_{in}$. Accordingly, all such changes come within the present invention.

I claim:

1. Structure comprising:
   a first voltage input lead for receiving an input voltage;
   transformer comprising a primary winding and a secondary winding, said primary winding having a first primary winding lead coupled to said first voltage input lead and a second primary winding lead, said secondary winding being coupled to deliver power to a load;
   a second voltage input lead for receiving a second input voltage;
   first switching means for connected said second primary winding lead to said second voltage input lead and then disconnecting said second primary winding lead from said second voltage input lead; and
   snubber means coupled to said second primary winding input lead for ensuring the voltage across said first switching means when said first switching means opens does not exceed a predetermined amount and for modulating the flyback pulse from the primary winding so that the sum of said input voltage plus the transformer flyback pulse amplitude tends to remain substantially constant, and for ensuring that said transformer does not saturate, and wherein power from said flyback pulse is returned to said first voltage input lead by said snubber means.

2. Structure of claim 1 wherein said snubber means comprises:
   capacitor means coupled to said second primary winding lead for receiving charge from said primary winding when said first switching means opens; and
   discharge means for at least partially discharging said capacitor means during a time period the length of which is dependent on the size of the flyback pulse across said primary winding.

3. Structure of claim 2 wherein when said capacitor means is discharged, energy from said capacitor is returned to said voltage input lead.

4. Structure of claim 1 wherein said transformer comprises a tertiary winding for providing a pulse when said first switching means opens, said structure further comprising:
   a capacitor coupled to said second primary winding lead for receiving charge when said first switching means opens;
   second switch means for conducting current from said capacitor during a time period the length of which is dependent on the magnitude of said pulse provided across said tertiary winding, said second switch means having a first current carrying lead coupled to a first lead of said capacitor and a second current carrying lead coupled to deliver power to said first voltage input lead.

5. Structure of claim 4 wherein said second switching means is an MOS transistor, said structure further comprising means for delivering to the gate of said MOS transistor a turn-off pulse when said MOS transistor begins to enter the linear mode of operation so that said MOS transistor only spends a small amount of time in said linear mode of operation.

6. Structure comprising:
   a first voltage input lead for receiving an input voltage;
   a transformer comprising a primary winding and a secondary winding, said primary winding having a first primary winding lead coupled to said first voltage input lead and a second primary winding lead, said secondary winding being coupled to deliver power to a load;

a second voltage input lead for receiving a second input voltage;

first switching means for connecting said second primary winding lead to said second voltage input lead and then disconnecting said second primary lead from said second voltage input lead; and snubber means coupled to said second primary winding input lead for ensuring the voltage across said first switching means when said first switching means opens does not exceed a predetermined amount and for modulating the flyback pulse from the primary winding so that the sum of said input voltage plus the transformer flyback pulse amplitude tends to remain substantially constant, and for ensuring that said transformer does not saturate, wherein said snubber means dissipates substantially no power from said flyback pulse during operation.

* * * * *